United States Patent
Hsu et al.

(10) Patent No.: US 7,109,806 B2
(45) Date of Patent: Sep. 19, 2006

(54) DEVICE AND METHOD FOR DETECTING PHASE DIFFERENCE AND PLL USING THE SAME

(75) Inventors: Tse-Hsiang Hsu, Hsinchu (TW); Chia-Hua Chou, Hsin Tien (TW)

(73) Assignee: Mediatek Inc., Hsin Chu (TW)

( * ) Notice: Subject to any disclaimer, the term of this patent is extended or adjusted under 35 U.S.C. 154(b) by 13 days.

(21) Appl. No.: 10/937,295

(22) Filed: Sep. 10, 2004

(65) Prior Publication Data
US 2005/0057314 A1    Mar. 17, 2005

(30) Foreign Application Priority Data
Sep. 12, 2003  (TW) .............................. 92125138 A

(51) Int. Cl.
*H03L 7/00* (2006.01)

(52) U.S. Cl. ............................. 331/25; 327/2
(58) Field of Classification Search ............... 331/25; 327/2, 12
See application file for complete search history.

(56) References Cited

U.S. PATENT DOCUMENTS

| | | | |
|---|---|---|---|
| 6,667,639 B1 * | 12/2003 | Oyama | 327/116 |
| 2002/0070813 A1 * | 6/2002 | Schrodinger | 331/25 |
| 2002/0075982 A1 * | 6/2002 | Doblar | 375/376 |

* cited by examiner

Primary Examiner—Joseph Chang
(74) Attorney, Agent, or Firm—Birch, Stewart, Kolasch & Birch, LLP

(57) ABSTRACT

A phase detector includes a first control unit and a second control unit to generate a first control pulse and a second control pulse representative of a phase difference between a reference signal and a first clock signal. The first control unit receives the reference signal and the first clock signal and generates the first control pulse. The first control pulse has a first pulse width that varies depending on the phase difference between the reference signal and the first clock signal. The second control unit receives the reference signal and a second clock signal and generates the second control pulse such that the second control pulse substantially overlaps the first control pulse and has a second pulse width that is a preset value. The second clock signal has a frequency higher than that of the first clock signal.

16 Claims, 10 Drawing Sheets

FIG. 2 (Related Art)

DEVICE AND METHOD FOR DETECTING PHASE DIFFERENCE AND PLL USING THE SAME

This application claims the benefit of the filing date of Taiwan Application Ser. No. 092125138, filed on Sep. 12, 2003, the content of which is incorporated herein by reference.

BACKGROUND

The invention relates to a phase detector, a phase detection method and a PLL (Phase-Locked Loop) using the phase detector, and more particularly a phase detector using a high-frequency clock as a trigger signal to make the control signals UP and DN overlap with each other, and a PLL using the phase detector in order to reduce the jitter.

FIG. 1 shows a block diagram of a conventional PLL. The PLL is for providing a recovery clock that is phase synchronized with the input signal (IN). For example, when the data of an optical disk medium is read, the PLL is utilized to lock the phase and frequency of the EFM (Eight-to-Fourteen Modulation) signal and to output a phase locked clock (PLCK) as a sampling clock for the EFM signal or a reference clock for other controls. Referring to FIG. 1, the conventional PLL 10 includes a phase detector 11, a charge pump 12, a loop filter 13, a VCO (Voltage Control Oscillator) 14, and optionally a frequency divider 15.

The phase detector 11 is used to detect a phase error between an input signal IN and a phase locked clock PLCK2, and output control pulses UP and DN to control the charge pump 12 according to the phase error. For example, when the phase of the phase locked clock PLCK2 leads that of the input signal IN, the width of the control pulse UP outputted from the phase detector 11 is smaller than that of the control pulse DN so that the charge pump 12 generates a negative control current Icp. At this time, the loop filter 13 reduces the control voltage Vct1 according to the negative control current Icp and thus lowers the frequency of the phase locked clock PLCK1 outputted from the VCO 14. On the contrary, when the phase of the phase locked clock PLCK2 lags behind that of the input signal IN, the width of the control pulse UP outputted from the phase detector 11 is larger than that of the control pulse DN so that the charge pump 12 generates a positive control current Icp. The loop filter 13 increases the control voltage Vct1 according to the positive control current Icp, and thus increases the frequency of the phase locked clock PLCK1 outputted from the VCO 14.

Figure 2:
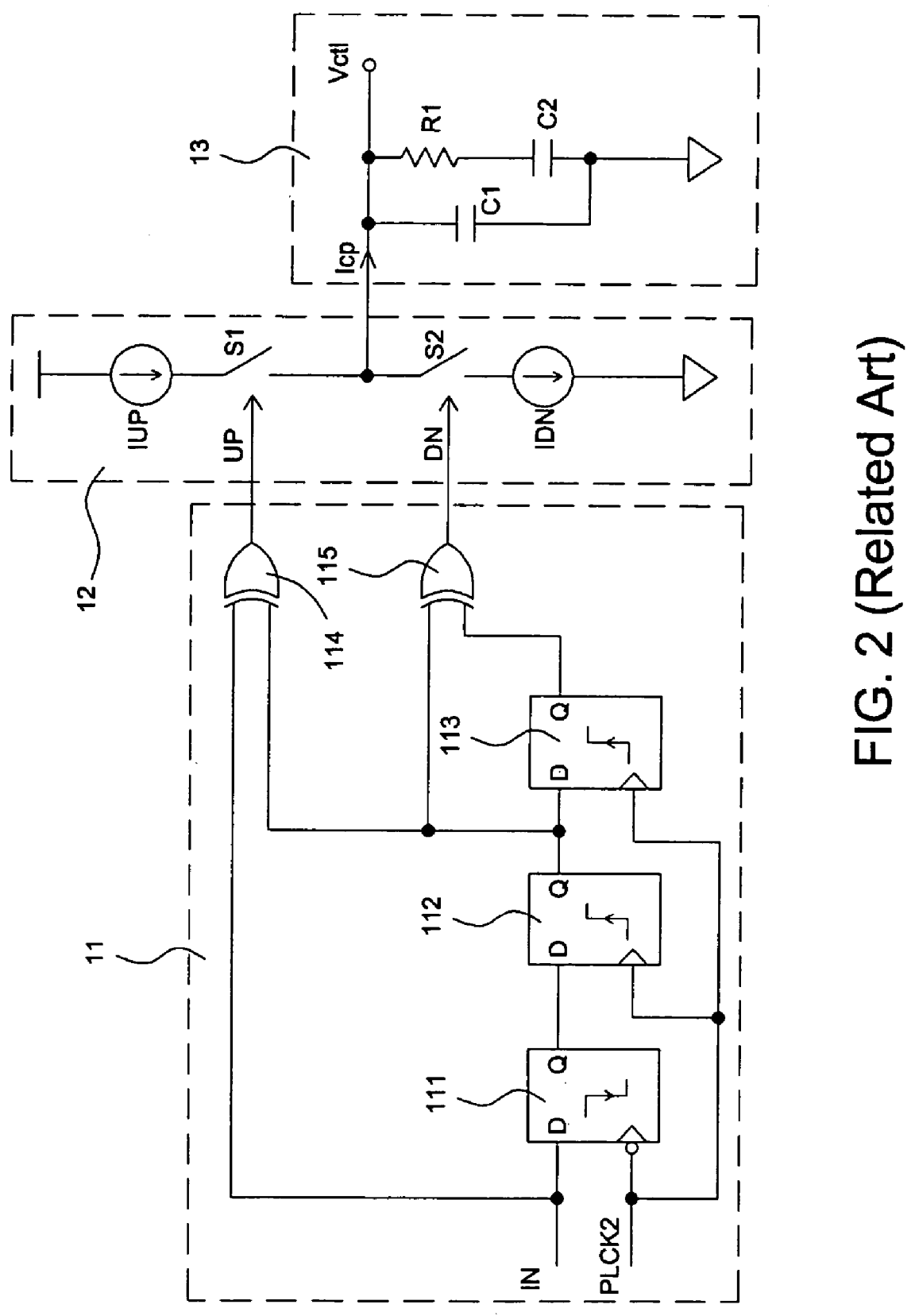

FIG. 2 shows a conventional circuit of a phase detector, a charge pump, and a loop filter of the PLL. Referring to FIG. 2, the phase detector 11 includes three flip-flops 111, 112 and 113, and two XOR (Exclusive OR) gates 114 and 115. The flip-flop 111 uses the input signal IN as its input signal and outputs its output signal to the input terminal of the flip-flop 112. The output signal of the flip-flop 112 is outputted to the input terminal of the flip-flop 113. The flip-flops 111, 112 and 113 use the phase locked clock PLCK2 as the trigger signal, wherein the flip-flop 111 is of the negative-edge trigger type and the flip-flops 112 and 113 are of the positive-edge trigger type. The XOR gate 114 receives the input signal IN and the output signal of the flip-flop 112, and generates the control pulse UP. The XOR gate 115 receives the output signals of the flip-flops 112 and 113 and generates the control pulse DN. The charge pump 12 includes two current sources IUP and IDN, and two switches S1 and S2. The control pulses UP and DN respectively control the switches S1 and S2 so as to generate the control current Icp. The loop filter 13 includes two capacitors C1 and C2 and a resistor R1. The loop filter 13 receives the control current Icp and then generates the control voltage Vct1.

FIG. 3 shows waveforms of some signals of the circuit in FIG. 2, including the input signal IN, the oscillation clock PLCK2, the control pulses UP and DN, and the control voltage Vct1 when the PLL is at the phase locked state. As shown in FIG. 3, because the control pulses UP and DN are not overlapped, the control voltage Vct1 is still changed periodically and transiently even though the PLL has reached the phase locked state. Thus, the oscillation clock outputted from the VCO 14 has jitters.

SUMMARY

In view of the above-mentioned problems, an object of the invention is to provide a phase detector using a high-frequency clock as a trigger signal to make the control signals UP and DN overlap with each other, and a PLL using the phase detector in order to reduce the jitter.

To achieve the above-mentioned object, the phase detector of the invention includes a first control unit and a second control unit to generate a first control pulse and a second control pulse representative of a phase difference between a reference signal and an oscillation clock. The first control unit receives the reference signal and the oscillation clock and generates the first control pulse. The first control pulse has a first pulse width that varies depending on the phase difference between the reference signal and the oscillation clock. The second control unit receives the reference signal and the high-frequency clock and generates the second control pulse such that the second control pulse substantially overlaps the first control pulse and has a second pulse width that is a preset value. The high-frequency clock has a frequency higher than that of the oscillation clock.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 2 shows conventional circuits of a phase detector, a charge pump, and a loop filter of the PLL.

DETAILED DESCRIPTION

The phase detector and PLL using the phase detector of the invention will be described with reference to the accompanying drawings.

Figure 1:
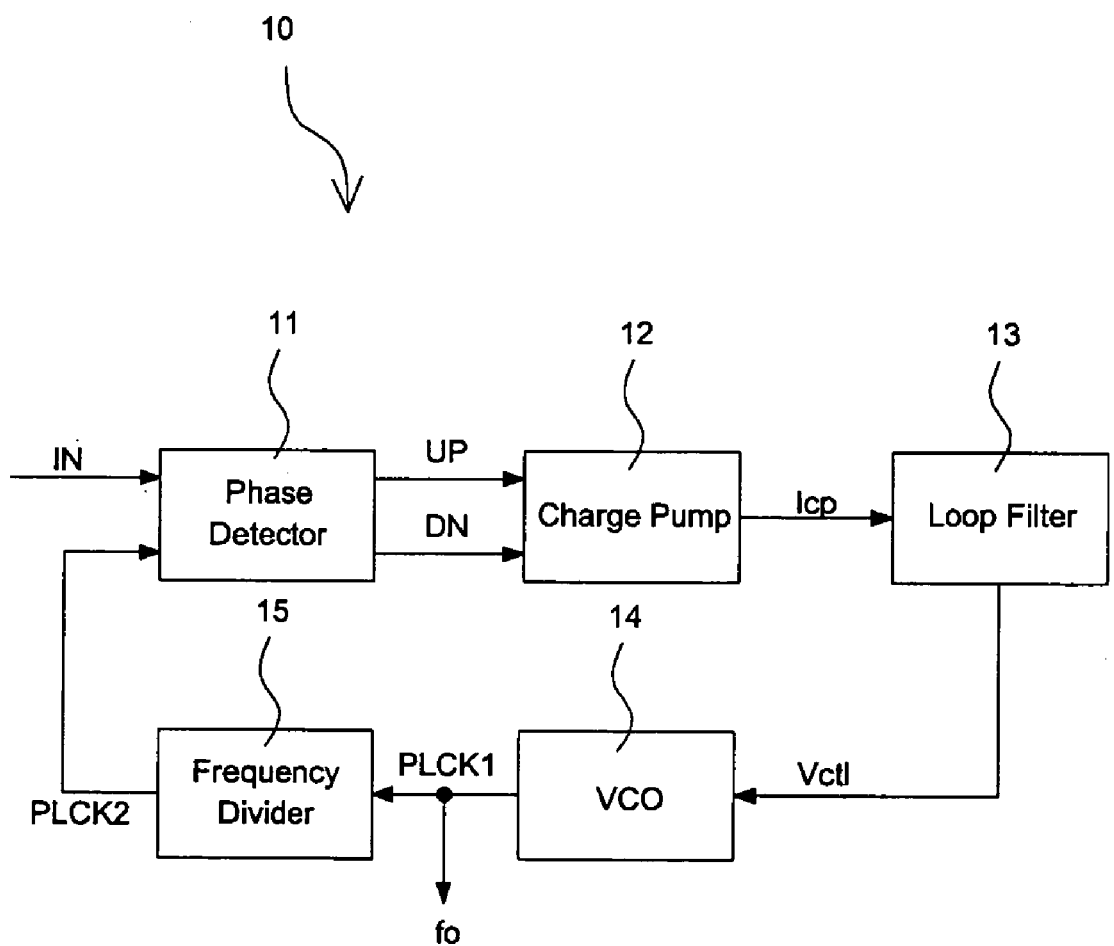
FIG. 1 shows a block diagram of a conventional PLL.
Figure 3:
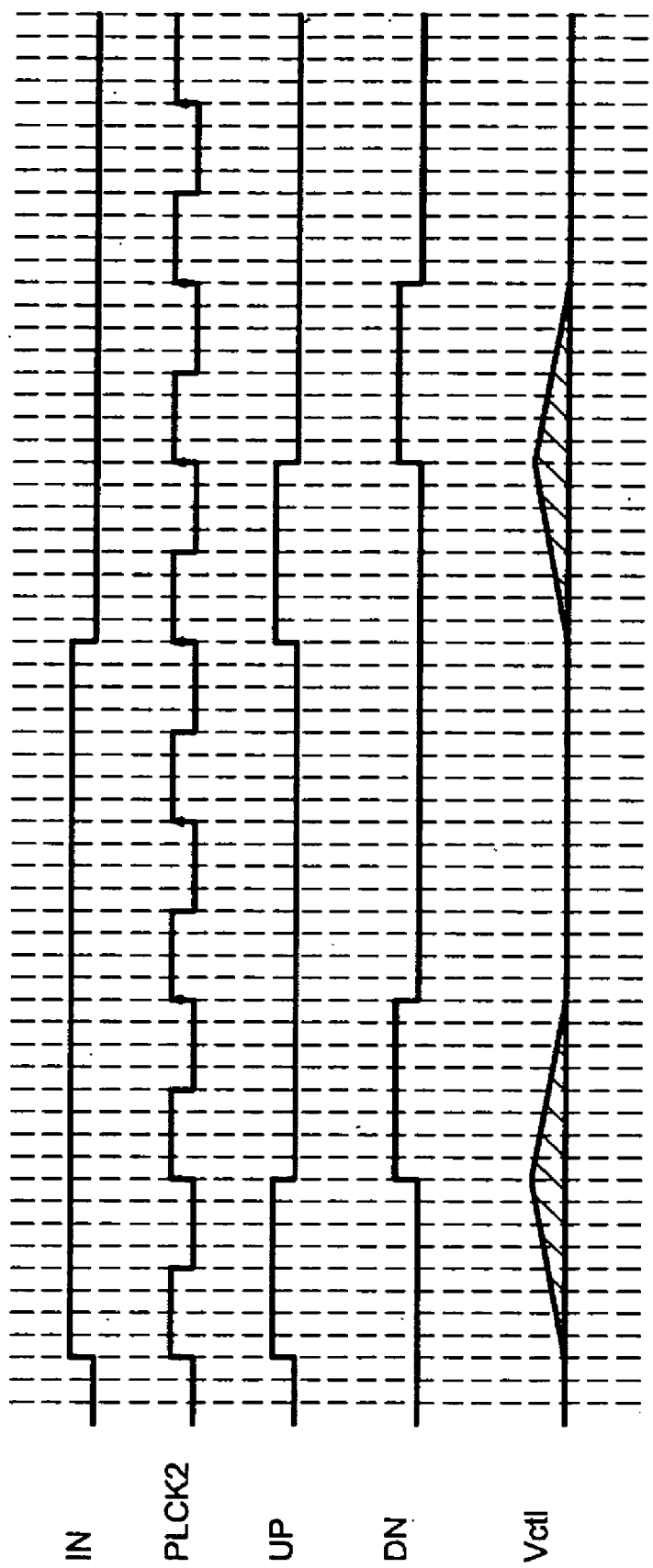
FIG. 3 shows waveforms of some signals of the circuit in FIG. 2, including an input signal IN, an oscillation clock PLCK2, control pulses UP and DN, and a control voltage Vct1 when the PLL is at the phase locked state.
Figure 4:
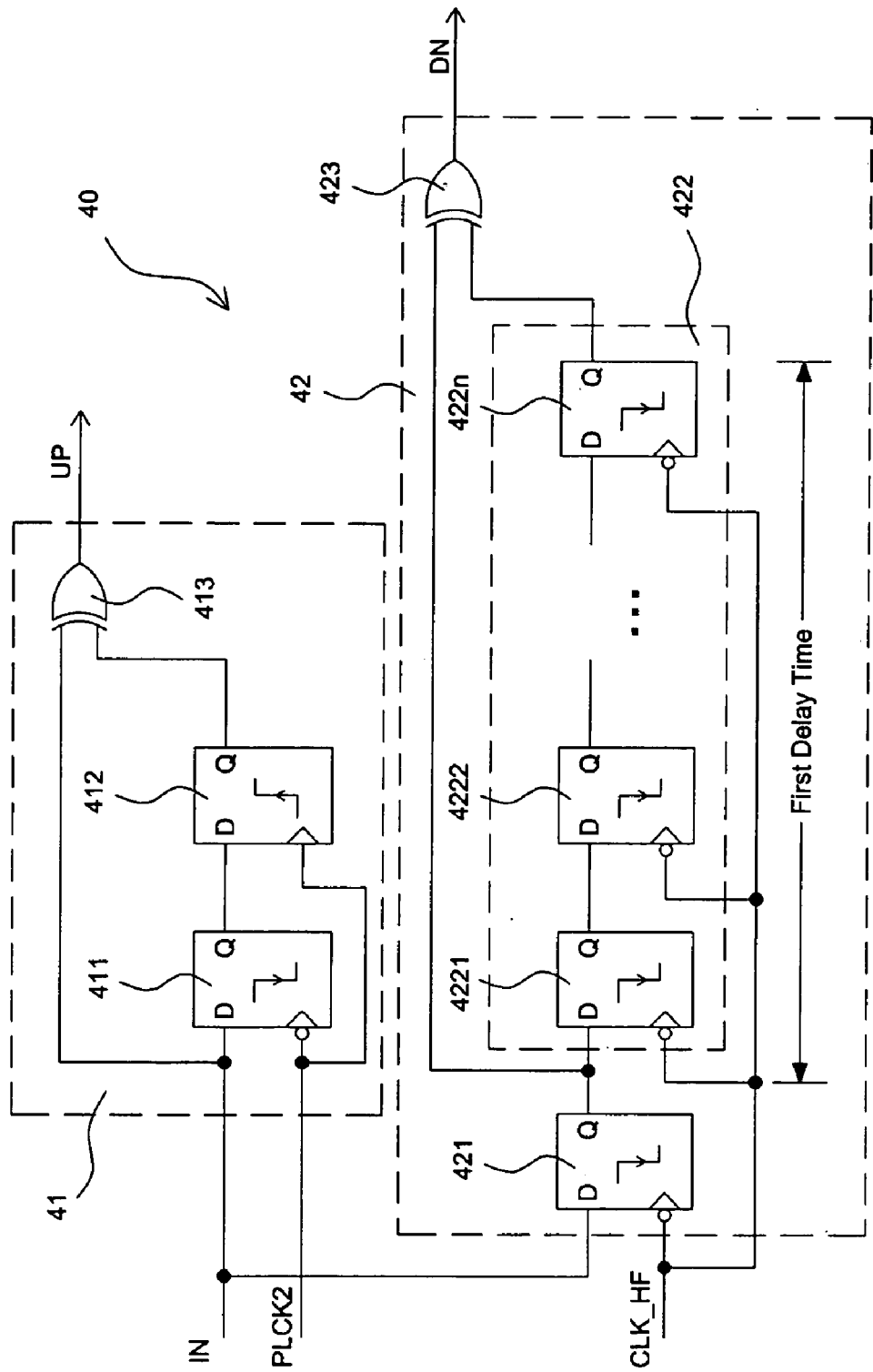
FIG. 4 shows a phase detector according to a first embodiment of the invention.

FIG. 4 shows a phase detector according to a first embodiment of the invention. Referring to FIG. 4, the phase detector 40 of the invention includes a first control unit 41 and a second control unit 42. The first control unit 41 receives an input signal IN, is clocked by an oscillation clock PLCK2 and generates a control pulse UP. The control pulse UP is enabled when the level change of the input signal IN is sensed by the first control unit 41, and normally will be disabled at the positive edge next to the upcoming negative edge of the oscillation clock PLCK2. The second control unit 42 receives the input signal IN, is clocked by a high-frequency clock CLK_HF and generates a control pulse DN. The control pulse DN is enabled when the level change of the input signal IN is sensed by the second control unit 42, and will be disabled after a period of first delay time. The time points that the control pulse DN is enabled/disabled are aligned at the edges of the high-frequency clock CLK_HF such that the first delay time can be easily implemented. The first delay time is typically one period of the oscillation clock PLCK2 in this embodiment. Let the ratio of the frequency of the high-frequency clock CLK_HF to the frequency of the oscillation clock PLCK2 be denoted by M. Either M or 2*M is preferably an integer such that the delay time could be designed easily. For example, if the frequency of the high-frequency clock CLK_HF is eight times that of the oscillation clock PLCK2, the first delay time may be set to eight cycles of the high-frequency clock CLK_HF.

The first control unit 41 includes flip-flops 411 and 412 and an XOR gate 413. The flip-flop 411 uses the input signal IN as its input signal and the oscillation clock PLCK2 as its trigger signal. The flip-flop 411 is of a negative-edge trigger type in this embodiment, and the output signal is coupled to the input terminal of the flip-flop 412. The flip-flop 412 uses the oscillation clock PLCK2 as the trigger signal and is of a positive-edge trigger type in this embodiment. The XOR gate 413 receives the input signal IN and the output signal of the flip-flop 412 and generates the control pulse UP. Suppose the output signals of the XOR gate 413, the flip-flop 411, and the flip-flop 412 are initially at low level. According to the circuit of the first control unit 41, once the input signal IN is changed from the low level to the high level, the XOR gate 413 will outputs the high level simultaneously to enable the control pulse UP. Next, when the oscillation clock PLCK2 is changed from the high level to the low level, the flip-flop 411 outputs the high level. Thereafter, when the oscillation clock PLCK2 is changed from the low level to the high level, the flip-flop 412 outputs the high level. At this time, because the two input terminals of the XOR gate 413 are both at the high level, the XOR gate 413 outputs the low level to disable the control pulse UP. After a period of time, when the input signal IN is further changed from the high level to the low level, the XOR gate 413 outputs the high level again to enable the control pulse UP because the output of the flip-flop 412 is the high level. Next, when the oscillation clock PLCK2 is changed from the high level to the low level, the flip-flop 411 outputs the low level. Thereafter, when the oscillation clock PLCK2 is changed from the low level to the high level, the flip-flop 412 outputs the low level. At this time, because the two input terminals of the XOR gate 413 are both at the low level, the XOR gate 413 outputs the low level to disable the control pulse UP.

The second control unit 42 includes a flip-flop 421, a delay unit 422, and an XOR gate 423. The flip-flop 421 uses the input signal IN as its input signal and the high-frequency clock CLK_HF as its trigger signal. The flip-flop 421 is of a negative-edge trigger type in this embodiment and the output signal is coupled to the input terminal of the delay unit 422. The delay unit 422 includes a plurality of flip-flops 422l to 422n for delaying the output signal of the flip-flop 421 by a period of the first delay time. The XOR gate 423 receives the output signals of the flip-flop 421 and the delay unit 422, and generates the control pulse DN whose pulse width will equal to the first delay time. Suppose the output signals of the XOR gate 423, the flip-flops 421 and 422n are initially at low level. According to the circuit of the second control unit 42, after the input signal IN is changed form the low level to the high level and when the high-frequency clock CLK_HF is changed from the high level to the low level, the flip-flop 421 outputs the high level. At this time, the XOR gate 423 outputs the high level simultaneously to enable the control pulse DN. Thereafter, the delay unit 422 outputs the high level after the first delay time has elapsed. At this time, because the two input terminals of the XOR gate 423 are both at the high level, the XOR gate 423 outputs the low level to disable the control pulse DN. After a period of time, when the input signal IN is changed from the high level to the low level and when the high-frequency clock CLK_HF is changed from the high level to the low level, the flip-flop 421 outputs the low level. At this time, the XOR gate 423 outputs the high level to enable the control pulse DN. Thereafter, the delay unit 422 outputs the low level after the first delay time has elapsed. At this time, because the two input terminals of the XOR gate 423 are both at the low level, the XOR gate 423 outputs the low level to disable the control pulse DN.

Figure 5:
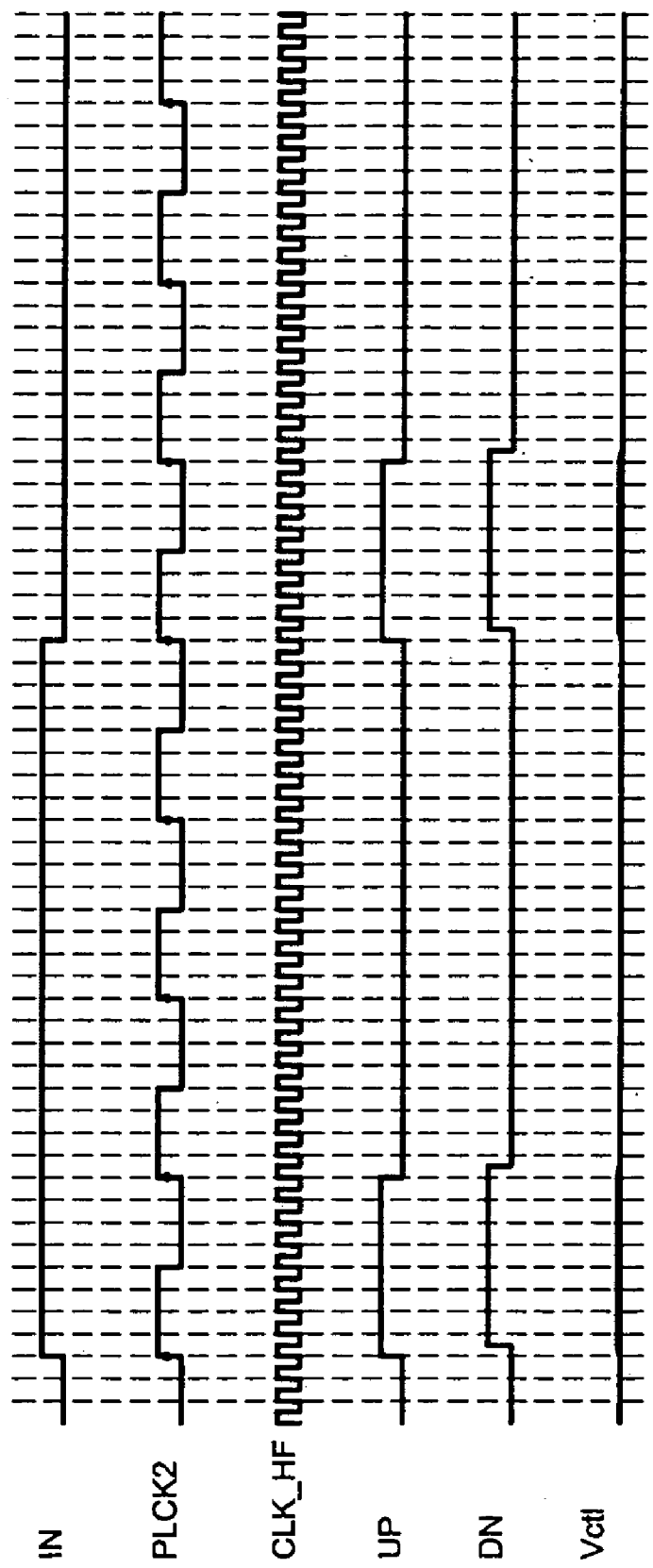
FIG. 5 shows exemplar waveforms of some signals of the circuit in FIG. 4 when the input signal and the oscillation clock have the same phase, including the input signal IN, the oscillation clock PLCK2, the high-frequency clock CLK_HF, the control pulse UP, the control pulse DN, and the control voltage Vct1.

FIG. 5 shows waveforms of some signals of the circuit in FIG. 4 when the input signal IN and the oscillation clock PLCK2 have the same phase, including the input signal IN, the oscillation clock PLCK2, the high-frequency clock CLK_HF, the control pulses UP and DN, and the control voltage Vct1. The frequency of the high-frequency clock CLK_HF shown in FIG. 5 is eight times that of the oscillation clock PLCK2, so the first delay time may be set to 8 cycles of the high-frequency clock CLK_HF. That is, the enable time of each control pulse DN equals one cycle of the oscillation clock PLCK2. For the example shown in the drawing, because the control pulses UP and DN have the same enable time and most of the time (7.5 cycles of the high-frequency clock CLK_HF cycle) is overlapped, the variation amount of the control voltage Vct1 is much smaller than that of the PLL using the conventional phase detector. In addition, because the input signal and the oscillation clock have the same phase, the control voltage Vct1 is always kept unchanged.

Figure 6:
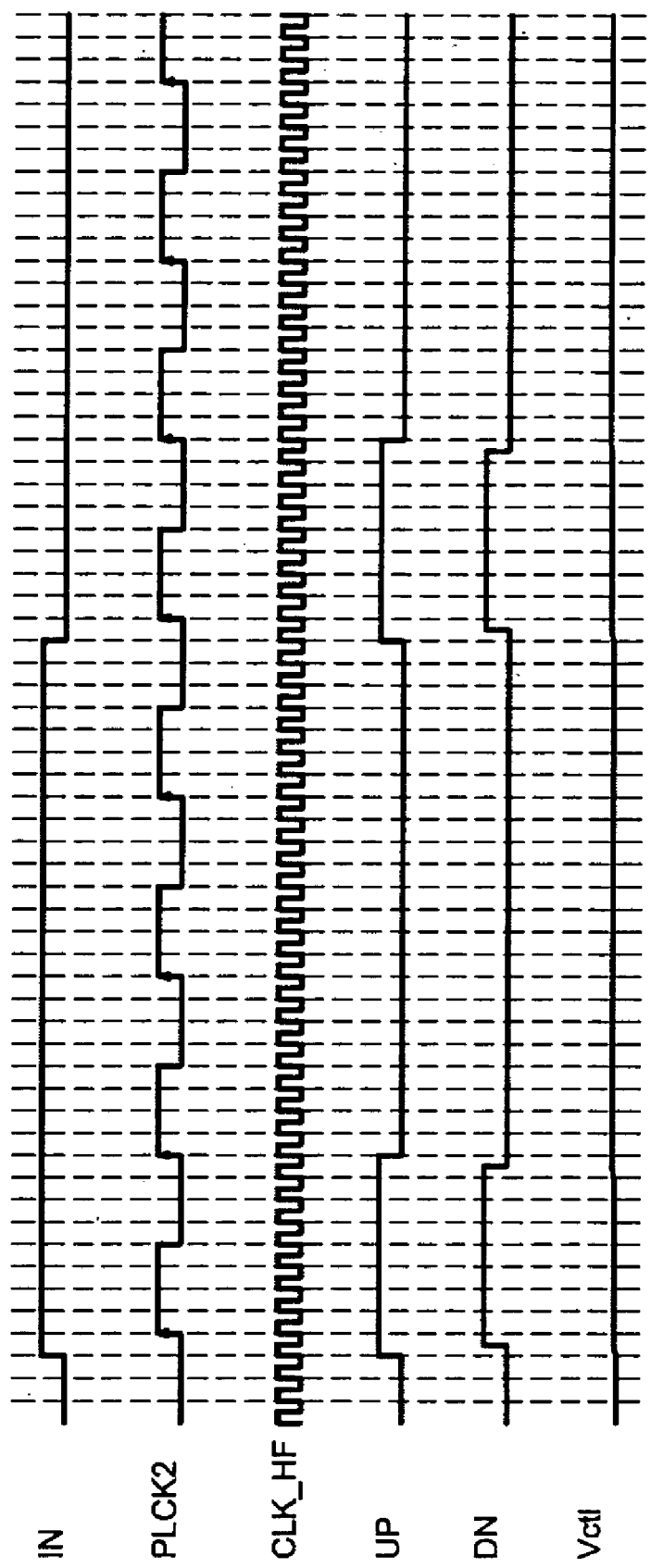
FIG. 6 shows exemplar waveforms of some signals of the circuit in FIG. 4 when the phase of the input signal leads that of the oscillation clock, including the input signal IN, the oscillation clock PLCK2, the high-frequency clock CLK_HF, the control pulse UP, the control pulse DN, and the control voltage Vct1.

FIG. 6 shows waveforms of some signals of the circuit in FIG. 4 when the phase of the input signal IN leads that of the oscillation clock PLCK2, including the input signal IN, the oscillation clock PLCK2, the high-frequency clock CLK_HF, the control pulses UP and DN, and the control voltage Vct1. For the example shown in the drawing, because the enable time of the control pulse UP is longer than that of the control pulse DN and is overlapped with that of the control pulse DN, the control voltage Vct1 increases in a slowly manner. As can be seen in this example, the phase detector according to the present invention could be free from the jitter which would be greatly induced in the conventional phase detector owing to the control voltage Vct1 is increasing greatly and then decreasing greatly. Because the phase of the input signal leads that of the oscillation clock, the control voltage Vct1 increases to thereby increase the frequency of the oscillation clock PLCK2 and thus shift the phase of the oscillation clock PLCK2 forward accordingly.

Figure 7:
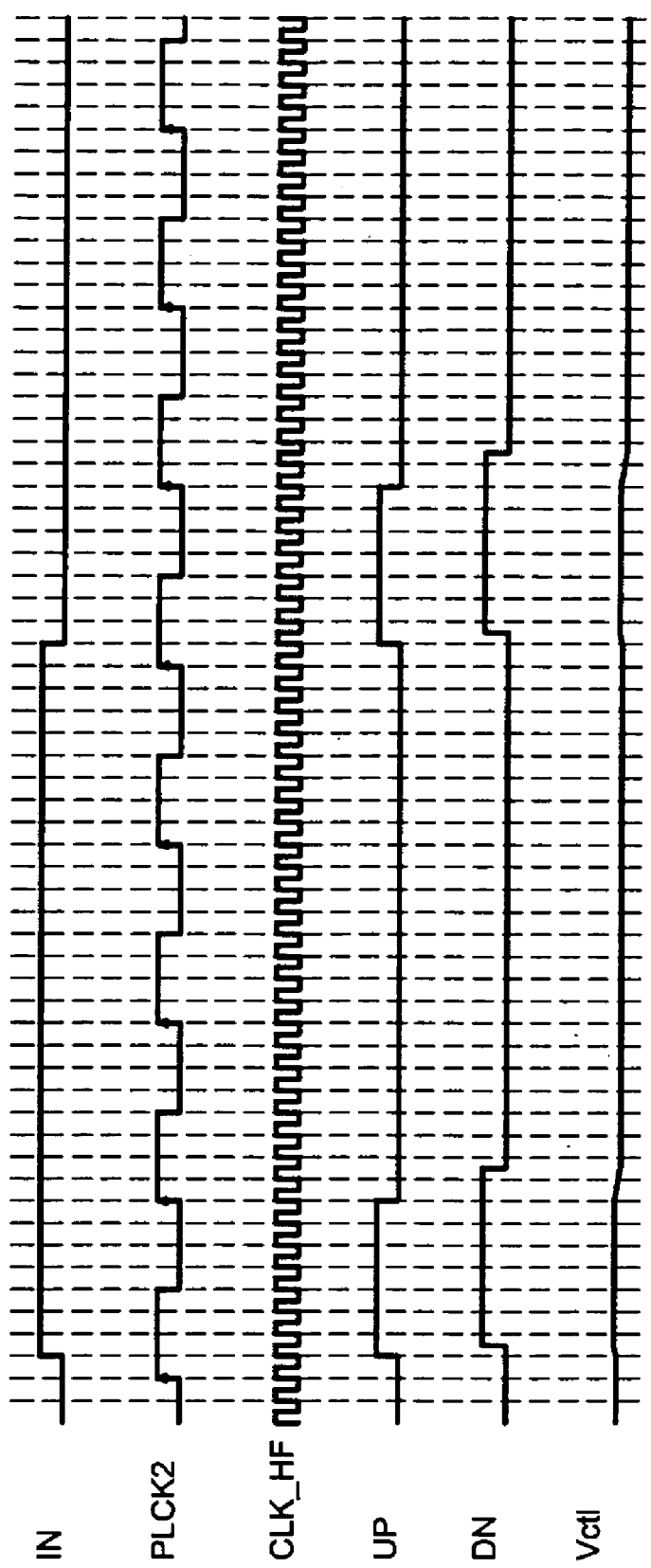
FIG. 7 shows exemplar waveforms of some signals of the circuit in FIG. 4 when the phase of the input signal lags behind that of the oscillation clock, including the input signal IN, the oscillation clock PLCK2, the high-frequency clock CLK_HF, the control pulse UP, the control pulse DN, and the control voltage Vct1.

FIG. 7 shows waveforms of some signals of the circuit in FIG. 4 when the phase of the input signal IN lags behind that of the oscillation clock PLCK2, including the input signal IN, the oscillation clock PLCK2, the high-frequency clock CLK_HF, the control pulses UP and DN, and the control voltage Vct1. For the example shown in this drawing, because the enable time of the control pulse UP is shorter than that of the control pulse DN and most of the enable time of the control pulse UP is overlapped with the enable time of the control pulse DN, the control voltage Vct1 slightly increases and then decreases. As can be seen in this example, the phase detector according to the present invention can greatly reduce the jitter which would be greatly induced in the conventional phase detector owing to the control voltage Vct1 is increasing greatly and then decreasing greatly. Because the phase of the input signal IN lags behind that of the oscillation clock PLCK2, the overall control voltage Vct1 is decreased so as to lower the frequency of the oscillation clock PLCK2 and thus shift the phase of the oscillation clock PLCK2 backward.

Figure 8:
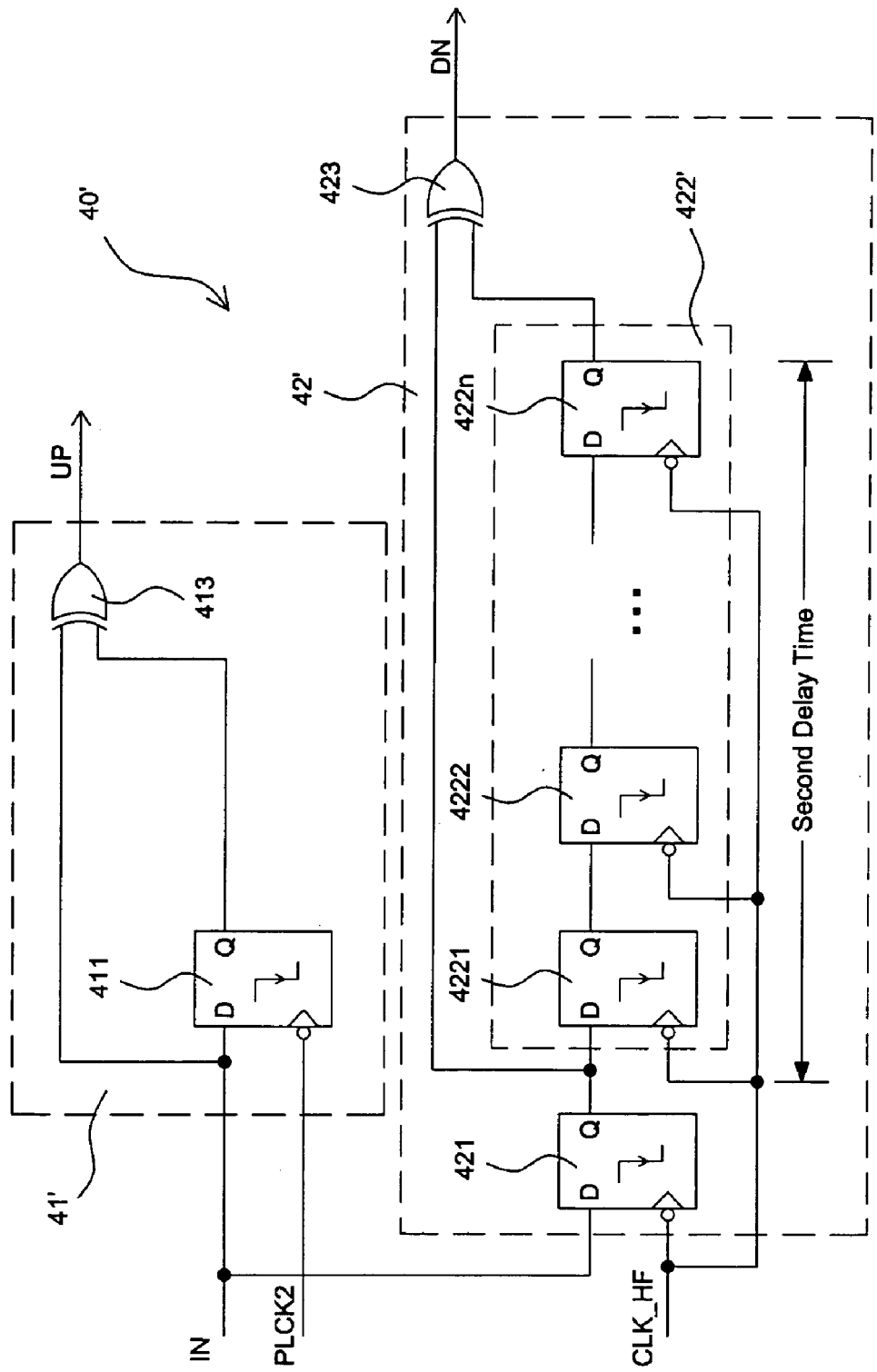
FIG. 8 shows a phase detector according to a second embodiment of the invention.

FIG. 8 shows a phase detector according to a second embodiment of the invention. Referring to FIG. 8, the phase detector 40' of the invention includes a first control unit 41' and a second control unit 42'. The first control unit 41' receives the input signal IN, is clocked by the oscillation clock PLCK2 and generates the control pulse UP. The control pulse UP is enabled once the level change of the input signal IN is sensed by the first control unit 41', and normally will be disabled at a next negative edge of the oscillation clock PLCK2. The second control unit 42' receives the input signal IN, is clocked by a high-frequency clock CLK_HF and generates the control pulse DN. The control pulse DN is?? enabled at a next negative edge of the high-frequency clock CLK_HF after the level change of the input signal IN is sensed by the second control unit 42', and normally will be disabled after a period of second delay time. In this embodiment, the second delay time is one half of a cycle of the oscillation clock PLCK2. For example, if the frequency of the high-frequency clock CLK_HF is eight times that of the oscillation clock PLCK2, the second delay time is set to four cycles of the high-frequency clock CLK_HF. The difference between the phase detector 40' of FIG. 8 and the phase detector 40 of FIG. 4 is that the enable widths of the control pulses UP and DN of the phase detector 40' is only one half that of the phase detector 40.

The first control unit 41' includes a flip-flop 411 and an XOR gate 413. The flip-flop 411 uses the input signal IN as its input signal and the oscillation clock PLCK2 as its trigger signal, and the flip-flop 411 is of a negative-edge trigger type in this embodiment. The XOR gate 413 receives the input signal IN and the output signal of the flip-flop 411 and generates the control pulse UP. Suppose the output signals of the XOR gate 413, the flip-flop 411 are initially at low level. According to the circuit: of the first control unit 41', once the input signal IN is changed form the low level to the high level, the XOR gate 413 outputs the high level simultaneously to enable the control pulse UP. Next, when the oscillation clock PLCK2 is changed from the high level to the low level, the flip-flop 411 outputs the high level. At this time, because the two input terminals of the XOR gate 413 are at the high level, the XOR gate 413 outputs the low level to disable the control pulse UP. When the input signal IN is changed from the high level to the low level, the XOR gate 413 outputs the high level to enable the control pulse UP because the output of the flip-flop 411 is still the high level. Next, when the oscillation clock PLCK2 is changed from the high level to the low level, the flip-flop 411 outputs the low level. At this time, because the two input terminals of the XOR gate 413 are at the low level, the XOR gate 413 outputs the low level to disable the control pulse UP.

The second control unit 42' includes a flip-flop 421, a delay unit 422', and an XOR gate 423. The second control unit 42' is similar to the second control unit 42 of FIG. 4 except that the second delay time of the delay unit 422' is one half that of the delay unit 422.

Figure 9:
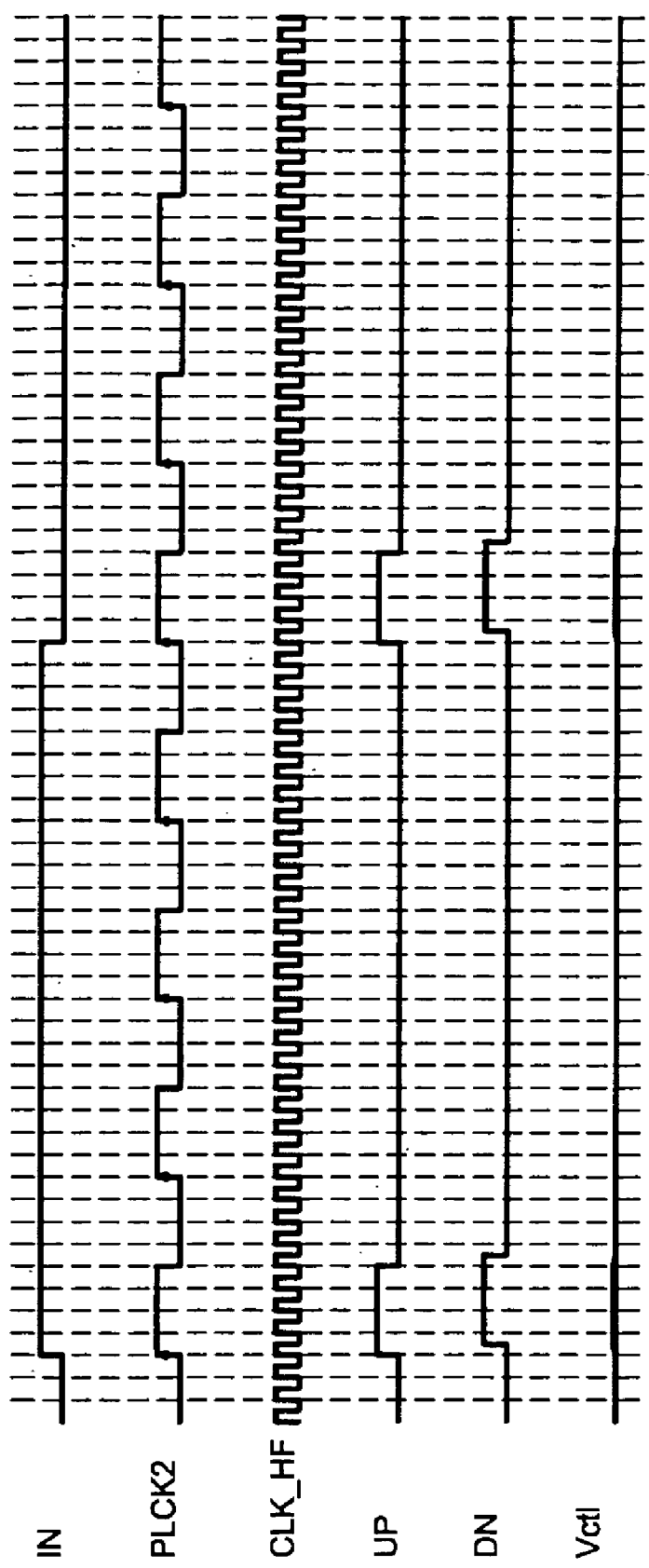
FIG. 9 shows waveforms of some signals of the circuit in FIG. 8 when the input signal and the oscillation clock have the same phase, including the input signal IN, the oscillation clock PLCK2, the high-frequency clock CLK_HF, the control pulse UP, the control pulse DN, and the control voltage Vct1.

FIG. 9 shows waveforms of some signals of the circuit in FIG. 8 when the input signal IN and the oscillation clock PLCK2 have the same phase, including the input signal IN, the oscillation clock PLCK2, the high-frequency clock CLK_HF, the control pulses UP and DN, and the control voltage Vct1. The frequency of the high-frequency clock CLK_HF in this example is eight times that of the oscillation clock PLCK2, so the second delay time is set to four cycles of the high-frequency clock CLK_HF. That is, the enable time of each control pulse DN equals a half cycle of the oscillation clock PLCK2. As shown in this drawing, because the control pulses UP and DN have the same enable time and most of the time (3.5 cycles of the high-frequency clock CLK_HF) are overlapped, the variation amount of the control voltage Vct1 is far smaller than the variation amount of the PLL using the conventional phase detector. In addition, because the input signal and the oscillation clock have the same phase, the control voltage Vct1 is always kept unchanged.

Figure 10:
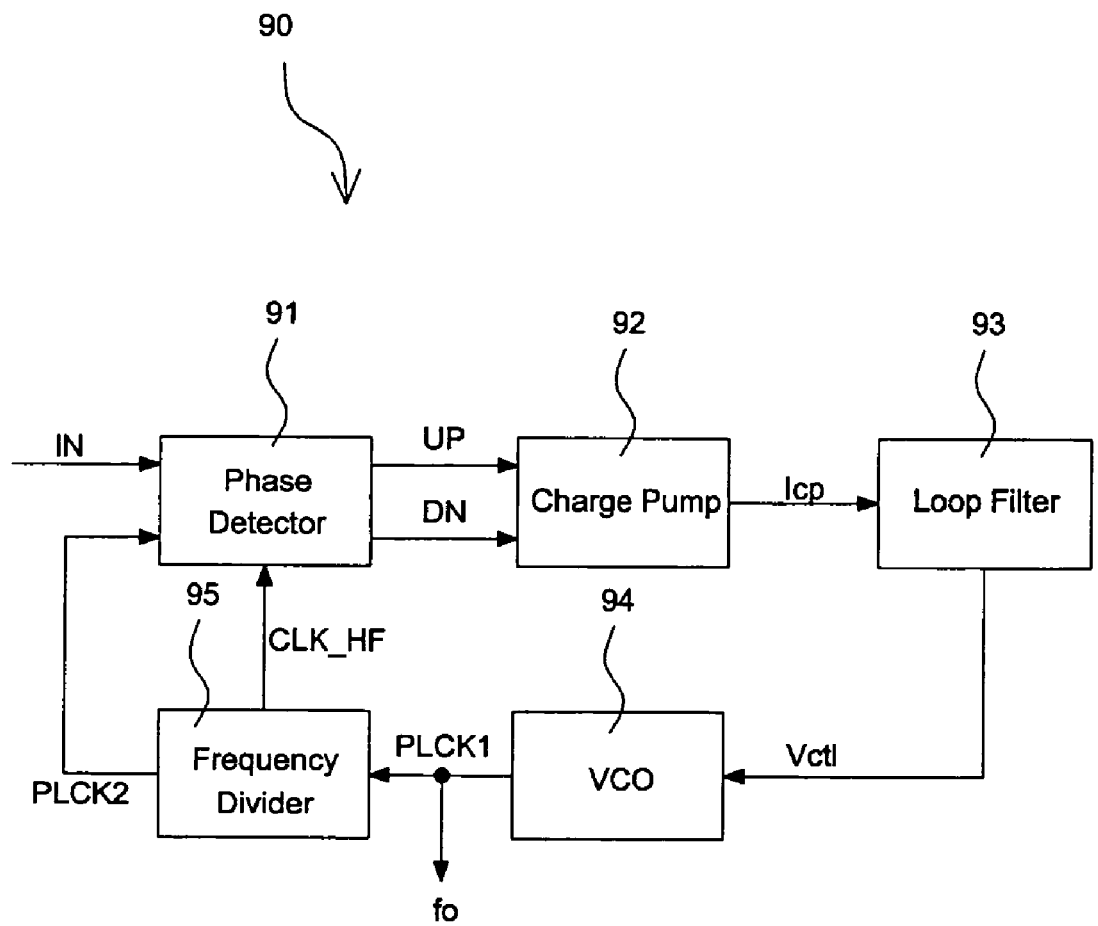
FIG. 10 shows the PLL using the phase detector of the invention.

FIG. 10 shows the PLL using the phase detector of the invention. Referring to FIG. 10, the PLL 90 includes a phase detector 91, a charge pump 92, a loop filter 93, a VCO 94, and a frequency divider 95. The architecture of the phase detector 91 is that of FIG. 4 or FIG. 8. Because the PLL 90 includes the frequency divider 95, the high-frequency clock required by the phase detector 91 may be acquired from the frequency divider 95 without adding additional circuit to produce the high-frequency clock.

While certain exemplary embodiments have been described and shown in the accompanying drawings, it is to be understood that such embodiments are merely illustrative of and not restrictive on the broad invention, and that this invention not be limited to the specific construction and arrangement shown and described, since various other modifications may occur to those ordinarily skilled in the art.

What is claimed is:

1. A phase detector for generating a first control pulse and a second control pulse representative of a phase difference between a reference signal and a first clock signal, the phase detector comprising:
   a first control unit for receiving the reference signal and the first clock signal and generating the first control pulse, the first control pulse having a first pulse width that varies depending on the phase difference between the reference signal and the first clock signal; and
   a second control unit for receiving the reference signal and a second clock signal and generating the second control pulse such that the second control pulse substantially overlaps the first control pulse and has a second pulse width that is a preset value;
   wherein the second clock signal has a frequency higher than that of the first clock signal.

2. The phase detector according to claim 1, wherein the frequency of the second clock signal is M times that of the first clock signal wherein M is a preset integer.

3. The phase detector according to claim 1, wherein the frequency of the second clock signal is M times that of the first clock signal wherein 2*M is a preset integer.

4. The phase detector according to claim 1, wherein the second control unit comprises:
   a second flip-flop for using the reference signal as its input signal and being edge-triggered by the second clock signal;
   a delay unit for receiving an output signal of the second flip-flop, delaying the output signal of the second flip-flop by a delay time which equals to the preset value, and then outputting a delay signal; and
   a second XOR gate for receiving the output signal of the second flip-flop and the delay signal and outputting the second control pulse.

5. The phase detector according to claim 4, wherein the preset value is substantially one half of a clock cycle of the first clock signal.

6. The phase detector according to claim 5, wherein the delay unit comprises a plurality of flip-flops which are edge-triggered by the second clock signal.

7. The phase detector according to claim 1, wherein the first control unit comprises:
   a first flip-flop for using the reference signal as its input signal and being edge-triggered by the first clock signal;
   a second flip-flop for using an output of the first flip-flop as its input signal and being edge-triggered by the first clock signal; and
   a first XOR gate for receiving the reference signal and an output signal of the second flip-flop and outputting the first control pulse.

8. The phase detector according to claim 7, wherein the second control unit comprises:
   a third flip-flop for using the reference signal as its input signal and being edge-triggered by the second clock signal;
   a delay unit for receiving an output signal of the third flip-flop, delaying the output signal of the third flip-flop by a delay time which equals to the preset value, and then outputting a delay signal; and
   a second XOR gate for receiving the output signal of the third flip-flop and the delay signal and outputting the second control pulse.

9. The phase detector according to claim 8, wherein the preset value is substantially one clock cycle of the first clock signal.

10. A PLL (Phase-Locked Loop) for generating an oscillation clock having substantially the same phase as a reference signal, the PLL comprising:
    a VCO (Voltage Control Oscillator) for receiving a control voltage and generating the oscillation clock;
    a phase detector for generating a first control pulse and a second control pulse representative of a phase difference between the reference signal and the oscillation clock;
    a charge pump for generating a control current according to the first control pulse and the second control pulse; and
    a loop filter for filtering the control current and generating the control voltage for the VCO, wherein the phase detector comprises:
    a first control unit for receiving the reference signal and the oscillation clock and generating the first control pulse, the first control pulse having a first pulse width that varies depending on the phase difference between the reference signal and the oscillation clock; and
    a second control unit for receiving the reference signal and a high-frequency clock and generating the second control pulse such that the second control pulse substantially overlaps the first control pulse and has a second pulse width that is a preset value;
    wherein the high-frequency clock has a frequency higher than that of the oscillation clock.

11. The PLL according to claim 10, further comprising a frequency divider coupled between the VCO and the phase detector for dividing the oscillation clock.

12. The PLL according to claim 11, wherein the high-frequency clock is obtained from an input terminal of the frequency divider.

13. A phase detection method for generating a first control pulse and a second control pulse representative of a phase difference between a first input signal and a second input signal, the method comprising the steps of:
    (a) generating the first control pulse by receiving the first input signal and the second input signal, the first control pulse having a first pulse width that varies depending on the phase difference between the first input signal and the second input signal; and
    (b) generating the second control pulse substantially overlapping the first control pulse by receiving the first input signal and a high-frequency clock having a frequency higher than that of the second input signal,
    wherein the second control pulse has a second pulse width that is a preset value.

14. The method according to claim 13, wherein the preset value is one clock cycle of the second input signal.

15. The method according to claim 13, wherein the preset value is one half of a clock cycle of the second input signal.

16. The method according to claim 13, wherein the step (b) further comprises generating a first delay signal by sampling the first input signal by a first flip-flop that is edge-triggered by the high-frequency clock;

generating a second delay signal by delaying an output signal of the flip-flop by a preset delay time which is multiples of half clock cycle of the high-frequency clock;

generating the second control pulse by XORing the first delay signal and the second delay signal.

* * * * *